United States Patent [19]

Ishida et al.

[11] Patent Number: 4,796,005
[45] Date of Patent: Jan. 3, 1989

[54] CIRCUIT DEVICE FOR A POSITIONAL ENCODER

[75] Inventors: Hiroshi Ishida; Mitsuyuki Taniguchi, both of Tokyo, Japan

[73] Assignee: Fanuc Ltd., Yamanashi, Japan

[21] Appl. No.: 81,963

[22] Filed: Aug. 5, 1987

Related U.S. Application Data

[62] Division of Ser. No. 051,211, May 12, 1987.

[30] Foreign Application Priority Data

Apr. 14, 1984 [JP] Japan .................. 59-73872
Aug. 17, 1984 [JP] Japan .................. 59-170489

[51] Int. Cl.[4] .......................... H03M 1/22
[52] U.S. Cl. .......................... 341/11; 318/603
[58] Field of Search .............. 318/603; 340/347 P

[56] References Cited

U.S. PATENT DOCUMENTS

| | | | |
|---|---|---|---|
| 2,926,335 | 2/1960 | Bower | 318/603 X |
| 3,914,760 | 10/1975 | Logue | 340/347 AD |
| 3,944,813 | 3/1976 | Fowler | 250/231 SE X |
| 4,117,320 | 9/1978 | Tomlinson et al. | 250/237 |
| 4,156,467 | 5/1929 | Patton et al. | 173/21 |
| 4,319,134 | 3/1982 | Weber | 250/231 |

FOREIGN PATENT DOCUMENTS 3030866 11/1982 Fed. Rep. of Germany .
1219757 10/1967 United Kingdom .

OTHER PUBLICATIONS

Electrical Design News, vol. 27, No. 20, Oct. 1982, page 187, Boston, MA, US: D. M. Pfister: "2-IC Circuit Decodes Quadrature Waveforms".

Primary Examiner—William M. Shoop, Jr.
Assistant Examiner—Richard K. Blum
Attorney, Agent, or Firm—Armstrong, Nikaido, Marmelstein & Kubovcik

[57] ABSTRACT

A circuit for an encoder apparatus of an incremental-type construction, including: a unit mechanically joined to a movable machine; a unit for outputting at least two signals having a phase shift and a periodic waveform in response to movement of the unit; a battery-type power supply; and an electric ciruit including a circuit for generating a timing pulse having predetermined frequency and pulse width, a circuit for detecting a change of the signals from the signal outputting circuit and for outputting a pulse signal in response to the change of signals, and a circuit for counting the pulse signal from the signal-change detecting circuit. The apparatus may be optical or magnetic in construction.

22 Claims, 11 Drawing Sheets

Fig. 4B CLK₀

Fig. 4C CLK₁

Fig. 5B  CLK₀

Fig. 5C  CLK₁

Fig. 8B CLK₀

Fig. 8C CLK₁

Fig. 12A SA₁
Fig. 12B SB₁
Fig. 12C CLK₀
Fig. 12D S_U
Fig. 12E S_D
Fig. 12F F3
Fig. 12G F4
Fig. 12H CS_U
Fig. 12I CS_D

CIRCUIT DEVICE FOR A POSITIONAL ENCODER

This is a division of application Ser. No. 051,211 filed May 12, 1987 pending.

BACKGROUND OF THE INVENTION

1. Field of the Invention

The present invention relates to a circuit device of an encoder apparatus, more particularly to an encoder apparatus having an incremental-type mechanism and providing an absolute-type position signal.

2. Description of the Related Art

Encoder apparatuses are extensively used for position detection in movable machines in numerical control (NC) systems, industrial robot systems, etc.

There are two main types of encoder apparatuses: incremental encoder apparatuses and absolute encoder apparatuses.

An optical incremental encoder apparatus includes a rotary shaft for connection to a movable work machine whose position is to be sensed and a rotary disk fixed to the rotary shaft and having a light-coding region provided along a circumferential line of the rotary disk. The light-coding region is formed with a plurality of light-intercept portions and a plurality of light-transparent portions or slits. The light-intercept portions and light-transparent portions have the same width along the circumferential line and are alternatively arranged.

The incremental encoder apparatus further includes a light-emitting device, such as light-emitting diode (LED), installed at a position opposing the light-coding region, and light-receiving devices, such as phototransistors or photodiodes (PD), located at another position opposing the light-coding region. The light-receiving devices face the light-emitting device across the light-coding region and slits of a fixed slit member installed between the light-receiving devices and the rotary disk.

The encoder apparatus also includes an electric circuit for outputting either an incremental pulse or a decremental pulse as a rotational position pulse in response to signals received from the light-receiving devices. A power source for activating the electric circuit is normally placed in a control unit away from the encoder apparatus.

The rotary shaft and the rotary disk rotate in response to movement of the work machine. The light emitted from the light-emitting device is received by the light-receiving devices through one of the light-transparent portions in the light-coding region and the slits in the fixed slit member. The electric circuit outputs an incremental pulse when the rotary shaft rotates in a forward direction and a decremental pulse when it rotates in a backward direction.

As clear from the above, incremental encoder apparatuses have simple constructions and a low number of structural elements. This facilitates assembly work and adjustment thereof. On the other hand, incremental encoder apparatuses suffer from the problem that, in the event of a power failure, the electric circuit cannot output incremental or decremental pulses. Despite the power failure, the work machine may still move, resulting in a discrepancy between the position value stored in the control unit and the actual position of the work machine. In such cases, when the power is restored, it is necessary to adjust the encoder apparatus using a reference position before normal operation can be resumed.

An optical absolute encoder apparatus includes a rotary shaft for connection to a movable work machine whose position is to be sensed and a rotary disk fixed to the rotary shaft and having a light-coding region. The light-coding region is formed with a plurality of concentric light-coding channels, each with a plurality of light-intercept portions and a plurality of light-transparent portions. Light-intercept portions and light-transparent portions are alternately arranged in each channel, the respective lengths of the intercept and transparent portions being defined by a predetermined relationship depending on the channel position. The light intercept-portions in the outermost channel on the rotary disk are usually equal in length to the light-transparent portions, so that a $\frac{1}{2}^1$ division pattern is defined. Similarly, the channel just inside the outermost channel defines a $\frac{1}{2}^2$ division pattern, and so on. The absolute angular position of the rotary disk is determined by the combination of transparent portions on a radial line in all channels. To obtain precise resolution of the angular position, concentric light-coding channels may be provided.

The absolute encoder apparatus further includes a plurality of light-emitting devices arranged in a line opposing a radial line of the rotary disk, each device facing a light intercept-coding channel, and light-receiving devices opposing the rotary disk on the other side; each device also facing a corresponding light-emitting device. The encoder apparatus also includes an electric circuit for outputting an angular position signal in an absolute form. Even in the absolute encoder apparatus, a power source is normally placed in the control panel away from the encoder apparatus.

Essentially, the signal output from the electric circuit represents the absolute angular position defined by the light received at the light-receiving devices through the transparent portions in the channels. This indicates the angular position of the rotary shaft and facilitates immediate restart after power failure without the troublesome reference position adjustment required in the incremental encoder apparatus. On the other hand, the absolute encoder apparatus has the disadvantage of a complex construction and troublesome assembly, meaning troublesome fine adjustment work.

In addition to optical encoder apparatus, there are also magnetic encoder apparatuses both incremental and absolute. These magnetic encoder apparatuses, however, have the same disadvantages as mentioned above.

In all the prior art encoder apparatuses, the light-emitting devices are always energized. Thus, there are the further disadvantages of high power consumption and, thus, a short service life of the light-emitting devices.

SUMMARY OF THE INVENTION

It is an object of the present invention to provide a circuit device for an encoder apparatus having a simple incremental type construction yet providing an absolute rotational position signal, and free from troublesome reference position adjustment after power failures.

It is another object of the present invention to provide a circuit device for an encoder apparatus with reduced power consumption.

According to the present invention, there is provided with an encoder apparatus of an incremental-type construction including a movable unit mechanically joined to a movable machine; a unit for outputting at least two signals having a phase shift and a periodic waveform in response to movement of the movable unit; a battery-type power supply; and an electric circuit including a circuit for generating a timing pulse having predetermined frequency and pulse width, a circuit for detecting a change of the signals from the signal outputting circuit and for outputting a pulse signal in response to the change of signals, and a circuit for counting the pulse signal from the signal-change detecting circuit.

The apparatus may be optical or magnetic in construction.

According to the present invention, the electric circuit of the rotary encoder apparatus may further include a circuit receiving the pulse signal from the signal-change detecting circuit, and generating a timing-pulse frequency control signal in accordance with a change of the received pulse signal with time. In this case, the timing-pulse generating circuit varies the frequency of the timing pulse in response to the timing-pulse frequency control signal.

According to the present invention, the electric circuit of the movement encoder apparatus may further include a circuit for detecting illegal pulse generation from the signal-change detecting circuit and correcting the pulse received from the signal-change detecting circuit. This circuit may be provided between the signal-change detecting circuit and the pulse-counting circuit. In this case, the timing-pulse frequency control signal generating circuit temporarily varies the timing-pulse frequency control signal so that a timing pulse having a higher frequency is generated from the timing-pulse generating circuit.

BRIEF DESCRIPTION OF THE DRAWINGS

Other objectives and features of the present invention will be described below in detail with reference to the accompanying drawings, in which.

DESCRIPTION OF THE PREFERRED EMBODIMENTS

Figure 1A:
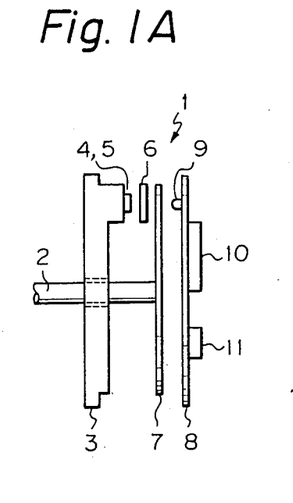
FIGS. 1A to 1C are schematic views of the construction of the present invention.
Figure 1B:
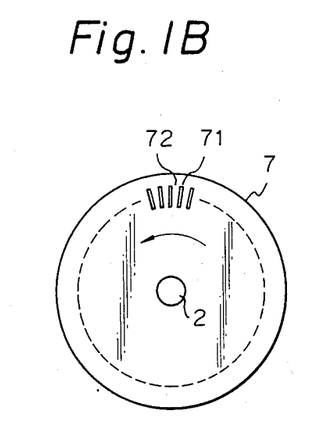

FIG. 1A is a sectional view of a mechanism of an incremental encoder apparatus of the present invention. In FIG. 1A, the encoder apparatus 1 includes a rotary shaft 2, mechanically connected to a work machine whose position is to be detected, such as an NC system, and rotatable in response to movement of the work machine, and a rotary disk 7, fixed to the rotary shaft 2 and cooperating therewith. FIG. 1B is a plane view of the rotary disk 7. The rotary disk 7 has a light-coding region consisting of a plurality of, for example, 2500, light-intercept portions 72 and a plurality of, for example, 2500, light-transparent portions 71 provided along a circumferential line (shown by dotted line). The width of each light-intercept portion 72 is equal to that of each light-transparent portion. The portions 72 and 71 are alternately arranged, as shown in FIG. 1B.

A printed circuit (PC) board 8 is provided at a position opposing the rotary disk 7 a predetermined distance away. A light-emitting device 9, such as an LED, is mounted on one side of the PC board 8 and facing the rotary disk 7 so that the light emitted therefrom (center line of beam emitted therefrom) strikes the light-coding region (center of region), i.e., strikes the dotted line in FIG. 1B. An electric circuit 10 and a battery 11 are mounted on the other side of the PC board 8.

The encoder apparatus 1 further includes a base 3 provided at another position opposing the rotary disk 7 a predetermined distance away and having a hole for passage of the rotary shaft 2 therethrough. Two light-receiving devices 4 and 5, such as photodiodes (PD), are provided on the base 3 and facing the LED 9.

Figure 1C:
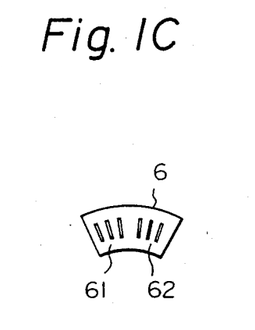

A fixed slit member 6 is provided between the PD's 4 and 5 and the light-encoding region on the rotary disk 7. FIG. 1C is a plane view of the fixed slit member 6. The fixed slit member 6 also has slits as shown in FIG. 1C. The slits face the light-coding region on the rotary disk 7 and allow passage of light from the rotary disk 7 to the PD's 4 and 5. The first PD 4 is arranged to receive the light transmitted through the slits 61 provided at the left side in FIG. 1C, while the second PD 5 is arranged to receive the light transmitted through the slits 62 provided at the right side. The arrangement of the PD's 4 and 5, the slits in the fixed slit member 6, the light coding region of the rotary disk 7 as well as the direction of the light from the LED 9 are defined to obtain signals from the PD's 4 and 5, which have periodic waveforms and a phase difference of approximately 90° ($\pi/2$ radian), in response to rotation of the rotary disk 7. When the rotary shaft 2 and thus the rotary disk 7 rotates in a forward direction, the signal from the PD 4 is 90° ahead in phase of that from the PD 5. When the rotary shaft 2 and the rotary disk 7 rotate in a backward direction, the signal from the PD 4 is 90° behind in phase from the PD 5.

The structure mentioned above with reference to FIGS. 1A to 1C is substantially similar to that of the conventional incremental encoder apparatus. Accordingly, the manufacture and assembly work are similar to that of the conventional apparatus. The fine adjustment work is also similar to that of the conventional apparatus.

The base 3, the fixed slit member 6, and the PC board 8 ae fixed in a housing (not shown). The rotary shaft 2 is rotatably supported on the base 2 by bearings (not shown) arranged in the hole of the base 3. Accordingly, the rotary disk 7 is rotatable between the fixed slit member 6 and the LED 9.

Figure 2:
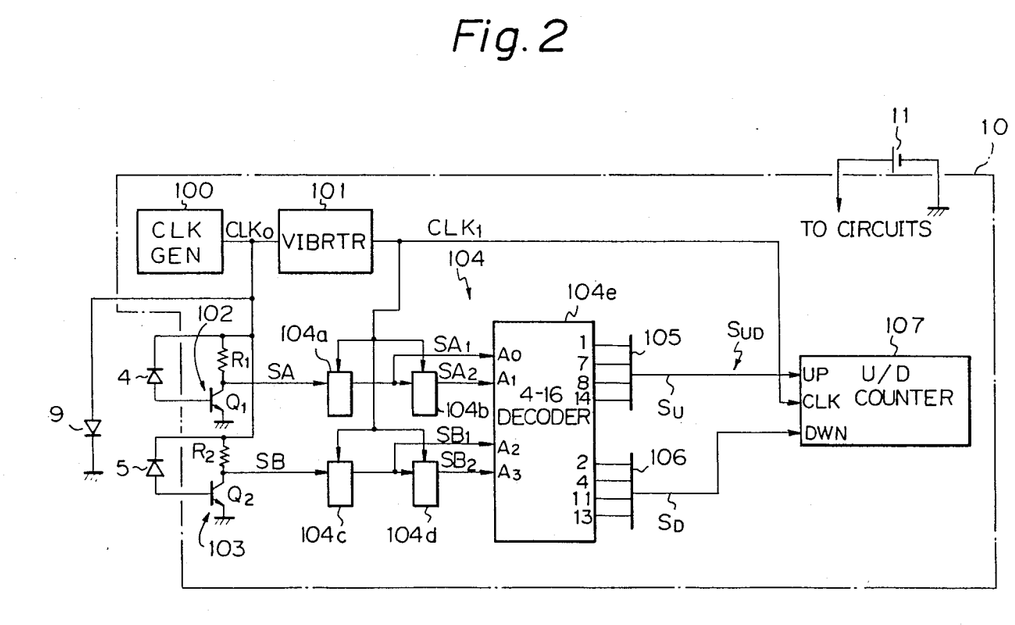
FIG. 2 is a block diagram of an embodiment of an electric circuit in accordance with the present invention.

The encoder apparatus includes an electric circuit. FIG. 2 is a block diagram of an embodiment of the electric circuit of the present invention.

In FIG. 2, the electric circuit 10 includes a timing pulse generator or a clock pulse generator 100, a monostable multivibrator 101, discriminating-amplifying circuits 102 and 103, a pulse rising/trailing edge detection circuit 104, OR gates 105 and 106, and an up/down (U/D) or universal counter 107.

Figures 4A, 4B:
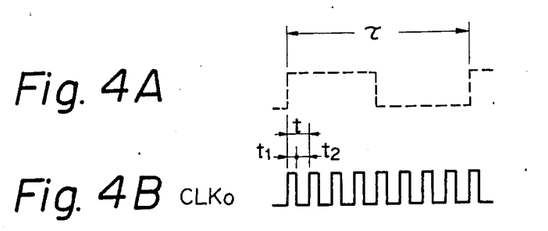
FIGS. 4A to 4J are timing charts of the electric circuits shown in FIG. 2.
Figure 4C:
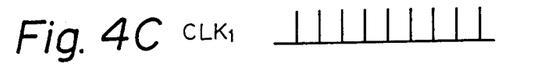

The pulse generator 100 generates a first clock pulse or a timing pulse $CLK_0$ having a predetermined frequency as shown in FIG. 4B and activating the LED 9 and the discriminating-amplifying circuits 102 and 103, respectively, connected to the PD's 4 and 5. The multivibrator 101 generates a second clock pulse $CLK_1$ in response to trailing edges of the clock pulse $CLK_0$, as shown in FIG. 4C. The clock pulse $CLK_1$ is applied to the circuit elements 104 to 107.

The discriminating-amplifying circuit 102 consists of a transistor $Q_1$ with an emitter connected to the ground and a resistor $R_1$ with one end connected to a collector of the transistor $Q_1$ and the other end to an output terminal of the pulse generator 100. The discriminating-amplifying circuit 102 is connected to the PD 4 in parallel, i.e., a cathode of the PD 4 is connected to the other end of the resistor $R_1$ and an anode to a base of the transistor $Q_1$. An electric output signal generated at the PD 4 normally has a sine-wave form due to the changing amplitude of light emitted from the LED 9, passed through one of light-transparent portions in the rotary disk 7 in rotation and the slits 61 in the fixed slit member 6, and received at the PD 4. However, its signal level is low. Receiving the output signal, the discriminating-amplifying circuit 102 discriminates the voltage level of the output signal with a predetermined voltage level, i.e., a threshold level of the transistor $Q_1:V_{th}$, and amplifies the discriminated signal to a predetermined logic level, whereby there is provided an A-phase pulse signal SA having a predetermined logic level and a frequency in response to the rotational speed of the rotary shaft 2.

Similarly, the discriminating-amplifying circuit 103 consists of a transistor $Q_2$ and a resistor $R_2$ and provides a B-phase pulse signal SB also having a predetermined logic level and a frequency in response to the rotational speed of the rotary shaft 2.

As mentioned before, there is a 90° phase shift between the output signals of the PD's 4 and 5. Accordingly, there is also 90° phase shift between the above A- and B-phase pulse signals SA and SB. This will be described later in detail with reference to the explanation of operation of the encoder apparatus.

The pulse rising/trailing edge (R/T) detection circuit 104 includes tandem-connected D-type flip-flops (D-F/F) 104a and 104b, tandem-connected D-F/F's 104c and 104d, and a 4-16 decoder 104e for decoding a four-binary-coded-decimal (4-BCD) signal to 16 binary signals.

Figure 3:
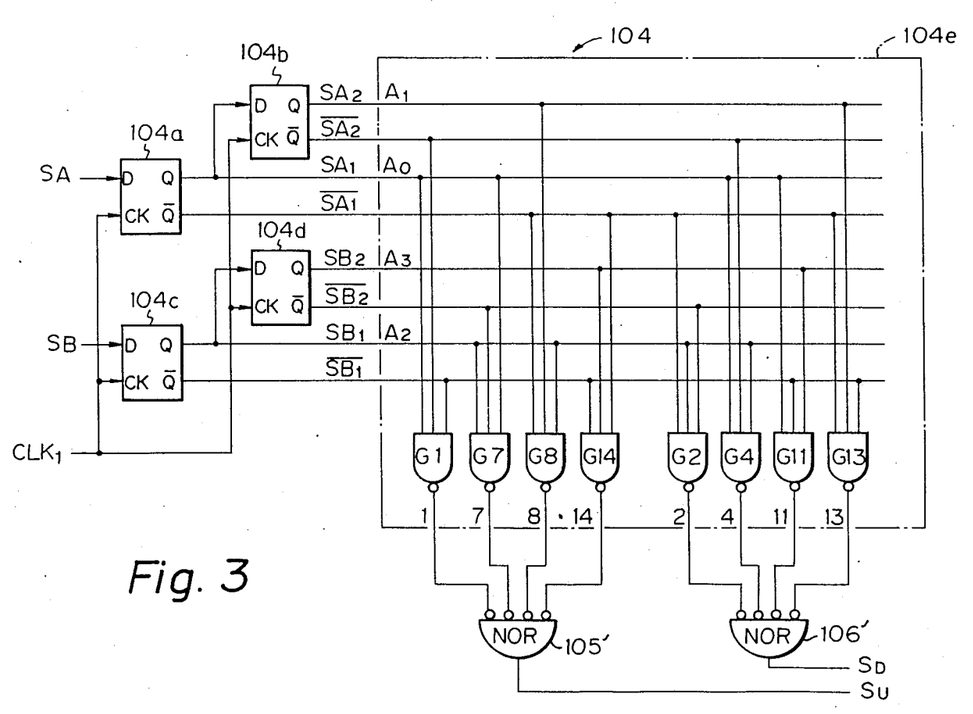
FIG. 3 is a detailed circuit diagram of part of the electric circuit shown in FIG. 2.

FIG. 3 is a detailed circuit diagram of a specific detection circuit 104. In FIGS. 2 and 3, the first D-F/F 104a receives the A-phase signal SA at its D-input terminal and outputs an A-phase signal SA1 delayed one clock by the clock signal $CLK_1$ to an input terminal $A_0$ of the 4-16 decoder 104e and a D-input terminal of the second D-F/F 104b. The D-F/F 104b outputs an A-phase signal SA2 delayed one clock further to an input terminal $A_1$ of the 4-16 decoder 104e. Inverter outputs $\overline{SA_1}$ and $\overline{SA_2}$ from the D-F/F's 104a and 104b are also applied to the 4-16 decoder 104e.

Similarly, the third and fourth D-F/F's 104c and 104d output B-phase signals SB1 and SB2 delayed by three and four clocks from the A-phase signal SA1 to input terminals $A_2$ and $A_3$ of the 4-16 decoder 104e and inverted signals thereof $\overline{SB1}$ and $\overline{SB2}$ to the 4-16 decoder 104e.

The signals SA1, SA2, SB1, and SB2 are weighted to express 4-BCD numbers 0 to 15, i.e., the signal SA1 is weighted to $2^0 (=1)$ when SA1 is high, the SA2 is weighted $2^1 (=2)$, the signal SB1 is weighted $2^2 (=4)$, and the signal SB2 is weighted $2^3 (=8)$.

The 4-16 decoder 104e consists of NAND gates G1, G7, G8, and G14 and G2, G4, G11, and G13. The NAND gates are connected to convert a 4-BCD signal into 16 binary signals on the basis of negative logic and a special relationship of signal timing of the signals $\underline{SA1}$, SA2, SB1, and SB2 and $\overline{SA1}$, $\overline{SA2}$, $\overline{SB1}$, and $\overline{SB2}$, which will be explained later. For example, the NAND gate G1 outputs a binary "1" signal having a low logic level when the input 4-BCD signal is "1".

Output signals from the NAND gates G1, G7, G8, and G14 indicate the forward directional rotation of the rotary shaft 2, while output signals from the NAND gates G2, G4, G11, and G13 indicate the backward directional rotation. This will be explained later.

As the significant logic levels of the NAND gates G1 to G14 are low, in FIG. 3, the OR gates 105 and 106 of FIG. 2 are replaced by NOR gates 105' and 106' to output an up- or incremental- and down- or decremental-pulse signals $S_U$ and $S_D$ having significant, high logic levels.

In FIG. 3, there are no gates G3, G5, G6, G9, G10, G12, G15, and G0, since these are not required to output the above signals $S_U$ and $S_D$.

The up/down (U/D) counter 107 has a predetermined number of bits for counting the light-transparent portions in the rotary disk 7, i.e., 2500 in the embodiment, to directly indicate the absolute angular position for one revolution of the rotary disk 7. The U/D counter 107 increases in position count when the up signal $S_U$ is applied to an UP input terminal and decreases in position count when the down signal $S_D$ is applied to a DWN input terminal.

The battery 11 shown in FIGS. 1A and 2 supplies a direct-current (DC) power to the electric circuit 10, the LED 9, and the PD's 4 and 5. The battery 11 may be a lithium battery, an alkaline-manganese battery, or the like in extensive use in industry and is not a special one.

The operation of the encoder apparatus shown in FIGS. 1A to 3 will be explained below with reference to FIGS. 4 and 5.

First, the operation in the case of forward movement of the work machine will be explained with reference to FIGS. 4A to 4J.

The rotary shaft 2 as well as the rotary disk 7 are rotated in response to the speed of movement of the work machine. In the embodiment, it is supposed that the maximum rotational speed of the rotary shaft 2 is 2500 rpm. As mentioned above, the number of the light-transparent portions in the rotary disk 7 is 2500. Accordingly, the frequency of the light passing through the light-transparent portions is 50 KHz when the rotary shaft 2 rotates at the maximum speed.

If the LED 9 were always energized, as in the prior art encoder apparatus, the output signal SA of the discriminating-amplifying circuit 102 would be a pulse and have a 20 μsec period (τ) consisting of 50% high level and 50% low level, as shown by a dotted line in FIG. 4A. In the embodiment of the present invention, however, in order to minimize the power consumption on the battery 11, the power is not always applied to the LED 9 and the PD's 4 and 5. In other words, these devices are activated for the minimum time possible for detecting the rotational position and the rotational direction of the rotary shaft 2.

The pulse-generating circuit 100 generates the clock pulse $CLK_0$ exciting the LED 9 and activating the discriminating-ampliyfing circuits 102 and 103. The clock pulse $CLK_0$ has a period t consisting of an on-time $t_1$ and an off-time $t_2$, as shown in FIG. 4B. From the viewpoints of minimum power consumption on the battery 11, the on-time $t_1$ should be as short as possible. However, it must enable stable operation of the LED 9, the PD's 4 and 5, as well as the electric circuit 10. Considering this, the on-time $t_1$ is set to 1 μsec. Now, turning to the period t, in order to detect the light received at the PD's 4 and 5, the period t must be equal to or less than the period τ shown in FIG. 4A. In order to detect the rising edge and/or trailing edge of the signals SA and SB for determining the direction of the rotary shaft's rotation, it is necessary to generate four consecutive A-phase pulses and four consecutive B-phase pulses during the time τ. Accordingly, the time t is set to 2.5 μsec. The off-time $t_2$ is consequently defined as 1.5 μsec. In other words, the frequency of the clock pulse $CLK_0$ is 200 KHz. The frequency of the clock pulse $CLK_1$ from the multivibrator 101 is also 200 KHz.

This enables a reduction in power consumption in the electric circuit 10, the LED 9, and the PD's 4 and 5. The power consumption in the embodiment may be reduced to 40% that of the prior art apparatus. This enables use of the battery 11 for the above electric elements instead of an external power supply normally placed in the control unit and eliminates the danger of power failure. Accordingly, the count in the counter 107 is never cleared by external power failure and always indicates the absolute rotational position.

Figure 4D:
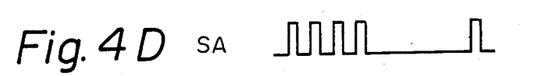
Figure 4E:
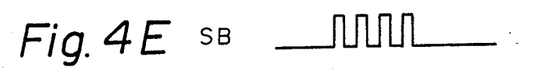
Figure 4F:
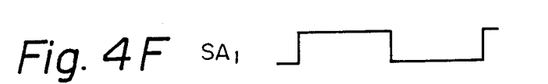
Figure 4G:
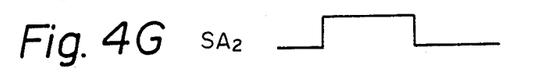

As the rotary shaft 2 rotates in the forward direction at maximum speed, the PD 4 receives light from the LED 9 through the light-transparent portion in the rotary disk 7 rotating the rotary shaft 2 and the slits 61 on the fixed slit member 6 in response to on-pulses of the clock signal $CLK_0$. It outputs four cycles of sine wave signals. Receiving the four cycles of sine wave signals, the discriminating-amplifying circuit 102 outputs of four consecutive A-phase pulses SA as shown in FIG. 4D. Similarly, the PD 5 outputs four cycles of sine wave signal, whereby, the discriminating-amplifying circuit 103 outputs four consecutive B-phase pulses SB as shown in FIG. 4E. Note that a first pulse of the signal SA leads a first pulse of the signal SB by 90° in phase.

The D-F/F 104a receives the signal SA, is set by the clock signal $CLK_1$, and outputs the signal SA1 of high level at the Q-output terminal (FIG. 4F) and the signal $\overline{SA1}$ of low level at the $\overline{Q}$-output terminal. The D-F/F 104b receives the signal SA1, is set with a next clock signal $CLK_1$, and outputs a high level signal SA2 and low level signal $\overline{SA2}$. The signal SA1 retains its high level when the pulses SA are applied to the D-F/F 104a, however, it changes to low level one clock pulse in time after the pulses SA no longer appear. The signal SA2 changes one clock pulse in time later.

Figure 4H:
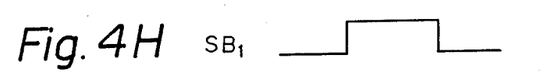
Figure 4I:
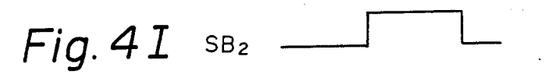
Figure 4J:
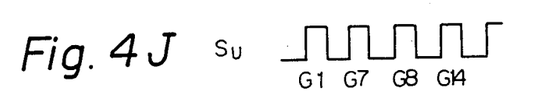

Similarly, the signals SB1 and SB2 are generated as shown in FIGS. 4H and 4I.

The signals SA1, SA2, SB1, and SB2 as well as their inverted signals $\overline{SA1}$, $\overline{SA2}$, $\overline{SB1}$, and $\overline{SB2}$ are applied to the 4-16 decoder 104e. The 4-16 decoder 104e, as shown in FIG. 3 in detail, outputs incremental pulses having "significant" low level at the NAND gates G1, G7, G8, and G14 when the 4-BCD of the signals SA1, SA2, SB1 and SB2 are "1", "7", "8", or "14", respectively. On the other hand, the 4-16 decoder 104e does not output decremental pulses at the NAND gates G2, G4, G11 and G13, because the 4-BCD signal is never "2", "4", "11", and "13" under forward rotation.

The incremental pulses are applied to the UP terminal of the U/D counter 107 through the gate 105 for counting.

Next, the operation in the case of backward movement of the work machine will be explained with reference to FIGS. 5A to 5J.

FIGS. 5A to 5J are timing charts of the encoder apparatus shown in FIGS. 2 and 3 and correspond to FIGS. 4A to 4J, respectively. The timing charts in FIGS. 5A to 5C correspond to those in FIGS. 4A to 4C.

Figure 5A:
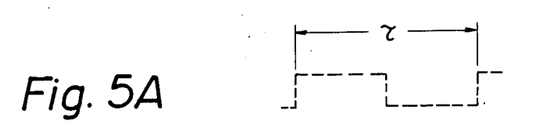
FIGS. 5A to 5J are other timing charts of the electric circuit shown in FIG. 2.
Figure 5B:
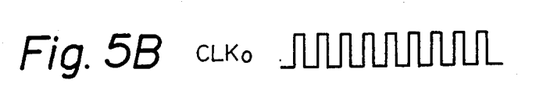
Figure 5C:
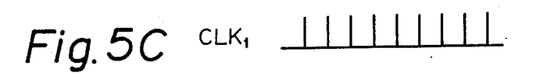
Figure 5D:
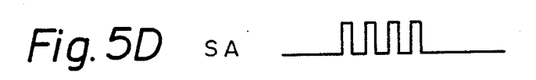
Figure 5E:
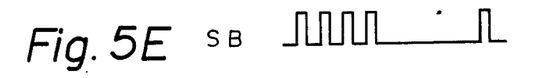
Figure 5F:
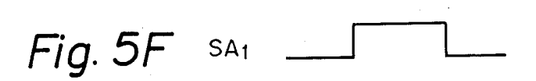
Figure 5G:
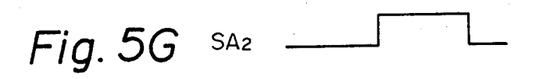
Figure 5H:
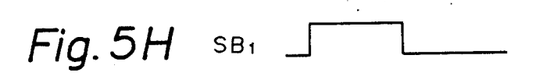
Figure 5I:
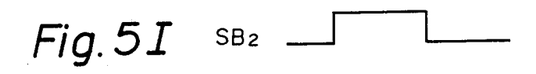
Figure 5J:
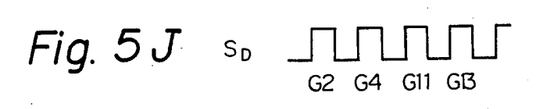

As the rotary shaft 2 rotates at maximum speed in the backward direction, the B-phase pulses SB are obtained prior to the A-phase pulses SA. A first pulse of the B-phase pulses SB leads a first pulse of the A-phase pulses SA by 90° in phase (FIGS. 5D and 5E). As a result, the signals SA1, SA2, SB1, and SB2 as shown in FIGS. 5F to 5I are generated from the D-F/F 104a to 104b and are applied to the 4-16 decoder 104e. In this case, the down signal $S_D$ is output from the NAND gates G2, G4, G11, and G13 in accordance with the timing relationship of the signals SA1, SA2, SB1, and SB2 and the inverted signals thereof and applied to the DWN terminal of the U/D counter 107 through the gate 106.

The U/D counter 107 decreases in count in response to the pulses applied to the DWN terminal.

As mentioned above, the count number in the U/D counter 107 is updated in response to the application of the up or down signals and indicates a current angular position of the rotary shaft 2, like the prior art absolute encoder apparatus.

As clearly understood from the above explanation, the encoder apparatus of the embodiment has the structure of the prior art incremental encoder apparatus, but can provide an absolute-type rotation position signal.

In addition, the encoder apparatus can output a rotation number signal by outputting a carry-over or carry-under signal from the U/D counter 107 every predetermined count number corresponding to the number of up or down signal pulses for one revolution of the rotary disk 7.

The encoder apparatus can further output a rotation direction on the basis of the up signal $S_U$ or the down signal $S_D$.

If the U/D counter 107 has a greater number of bits, for example, 16 bits expressing 0 to 65,536 and enabling counting of the entire range of movement of the work machine, the count in the U/D counter 107 can directly indicate the absolute position of the work machine. In this case, a center portion of the work machine movement range may be preset as a center number of the full count of the U/D counter 107. This would facilitate the position adjustment normally required at an initial stage and simplifies the control unit which receives the position signal, since no pulse-accumulating circuit is needed in the control unit.

The U/D counter 107 can be easily replaced by a counter, for the up signal, having a predetermined number of bits; a counter, for the down signal, having a predetermined number of bits; and an arithmetic circuit, connected to those counters, for arithmetic operations on the incremental and decremental number counted therefrom, to output the absolute-type rotation signal, the rotational direction signal, and/or the absolute-type position signal of the work machine.

To further reduce the power consumption, it is preferable to form the electric circuit by a complementary metal-insulating semiconductor (C-MIS) device.

In the above explanation, maximum rotation of the rotary shaft 2 was assured. However, the rotary shaft 2 rotates in response to the movement speed of the work machine and thus frequently is at rest. For example, when the rotary shaft 2 rotates at 600 rpm, the period $\tau$ mentioned above with reference to FIG. 4A becomes 40 $\mu$sec. This means a clock pulse $CLK_0$ of 200 KHz frequency is not necessary. The same result as mentioned before, can be obtained by a clock pulse $CLK_0$ of 100 KHz frequency. Of course, the time $t_1$ activating the electric elements is maintained as is, i.e., 1 $\mu$sec, and times t and $t_2$, are changed to 5 $\mu$sec and 4 $\mu$sec.

Figure 6:
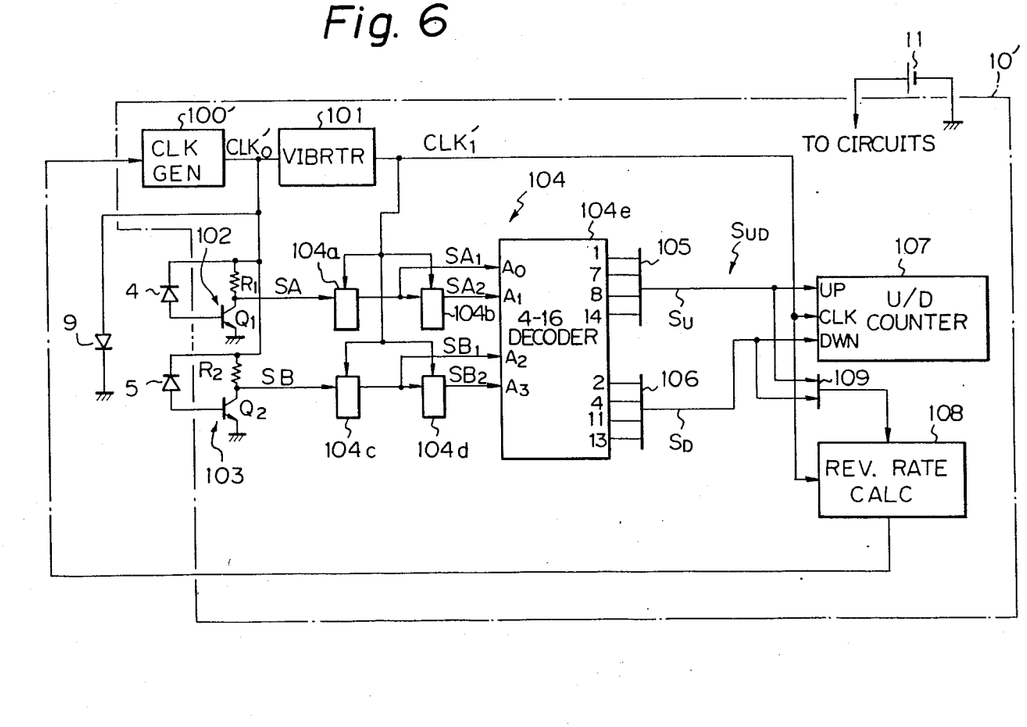
FIG. 6 is block diagram of another embodiment of an electric circuit in accordance with the present invention.

FIG. 6 is a circuit diagram of another embodiment of the present invention.

In FIG. 6, an electric circuit 10' further includes a revolution rate calculation circuit 108 and an OR gate 109. In addition, a clock-pulse generating circuit 100' is replaced by a variable-frequency type.

Figure 7A:
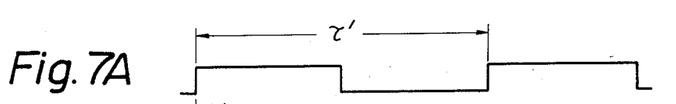
FIGS. 7A and 7B are timing charts of the electric circuit shown in FIG. 6.
Figure 7B:
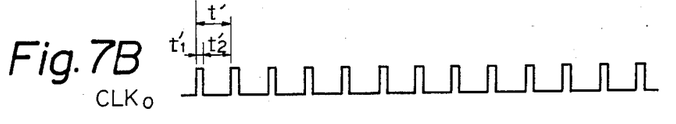

The revolution rate calculation circuit 108 calculates the revolution rate of the rotary shaft 2 on the basis of the time between consecutive up or down signals $S_U$ or $S_D$ received through the gate 109 and outputs the revolution rate calculated therein to the clock-pulse generating circuit 100'. To improve the reliability of the revolution rate change, an average revolution rate can be obtained. The clock-pulse generating circuit 100' varies in output frequency in response to the revolution rate, the frequency being set to a maximum 200 KHz for a maximum revolution rate and a frequency, for example, 20 KHz minimum for a minimum revolution rate, which may be zero. FIGS. 7A and 7B are timing charts of the circuit 10'. In FIGS. 7A and 7B, the times t', $t_1'$ and $t_2'$ are respectively 5 $\mu$sec, 1 $\mu$sec and 4 $\mu$sec. The electric circuit 10' contributes to significant reductions in the power consumption. Accordingly, the service life of the battery is significantly extended.

Figure 8A:
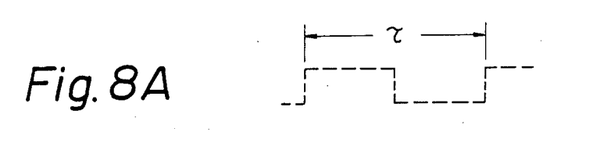
FIGS. 8A to 8K are other timing charts of the electric circuit shown in FIG. 6.
Figures 8B, 8C:
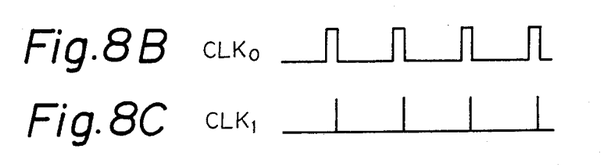
Figures 8D, 8E:
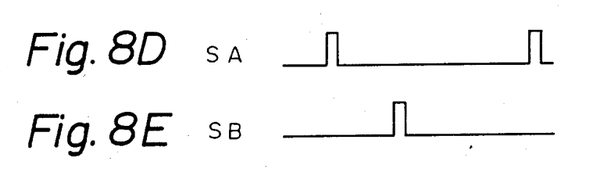
Figure 8F:
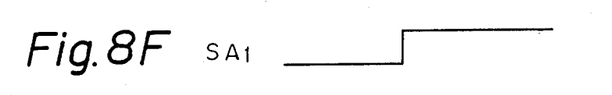
Figure 8G:
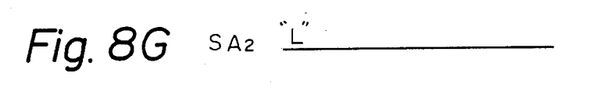
Figure 8H:
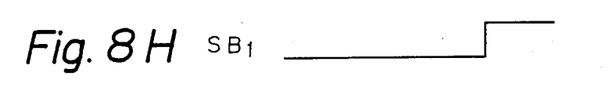
Figures 8I, 8J, 8K:
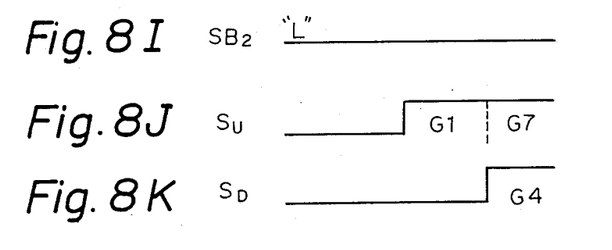

In the embodiment shown in FIG. 6, however, there is a slight defect. FIGS. 8A to 8K are other timing charts of the embodiment in FIG. 6. FIGS. 8A to 8I correspond to FIGS. 4A to 4I. FIGS. 8J and 8K correspond to FIGS. 4J and 5J.

The minimum frequency of the clock pulse $CLK_0$ is set with a predetermined margin to respond to a normal rotational speed change from low speed, for example, zero speed, to high speed without missing position detection. However, if an unexpectedly large, but short period rotational force, for example, due to a shock, were applied to the rotary shaft 2 when the frequency of the clock pulse $CLK_0$ were minimum, i.e., when there were no clock pulse $CLK_0$ or clock pulse $CLK_1$ for detecting the above signal change in the circuit 104, both the up and down signals $S_U$ and $S_D$ would rise in parallel, as shown in FIGS. 8J and 8K. In the example, the signal $S_U$ is formed by a pulse output from the gate G1 and a pulse output from the gate G7, these pulses being continued as one long, high-level signal. The signal $S_D$ is output from the gate G4. In this case, the count value in the U/D counter 107 cannot be updated. As a result, error in position detection may arise.

Figure 9:
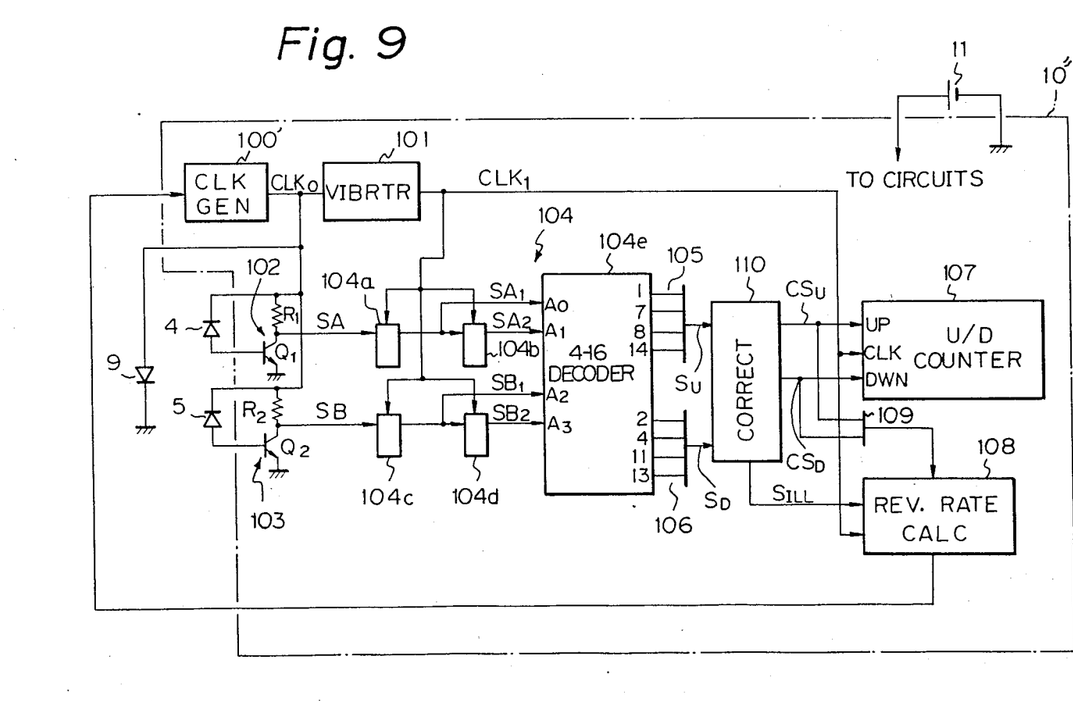
FIG. 9 is a block diagram of still another embodiment of an electric circuit in accordance with the present invention.

Another embodiment without this defect will now be explained. FIG. 9 is a circuit diagram of still another embodiment of the present invention.

An electric circuit 10'' in FIG. 9 further includes a pulse correction circuit 110 between the gates 105 and 106 and the U/D counter 107. Other elements in FIG. 9 are similar to the corresponding elements in FIG. 6 and bear the same reference as in FIG. 6.

The pulse correction circuit 110 receives the up and down signals $S_U$ and SHD D and outputs corrected up and down signals $CS_U$ and $CS_D$ to the U/D counter 107 and an illegal pulse detection signal $S_{ILL}$ to the revolution rate calculation circuit 108.

Figure 10:
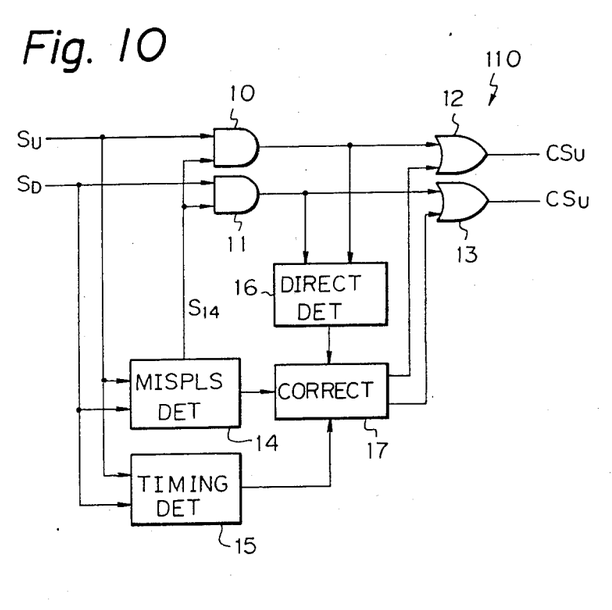
FIG. 10 is a block diagram of a pulse-correction circuit shown in FIG. 9.

FIG. 10 is a circuit diagram of an example of the pulse correction circuit 110. In FIG. 10, the pulse correction circuit 110 consists of AND gates 10 and 11, OR gates 12 and 13, an illegal pulse detection circuit 14, a timing detection circuit 15, a direction detection circuit 16, and a correction circuit 17. They are connected as shown in FIG. 10.

Figure 11:
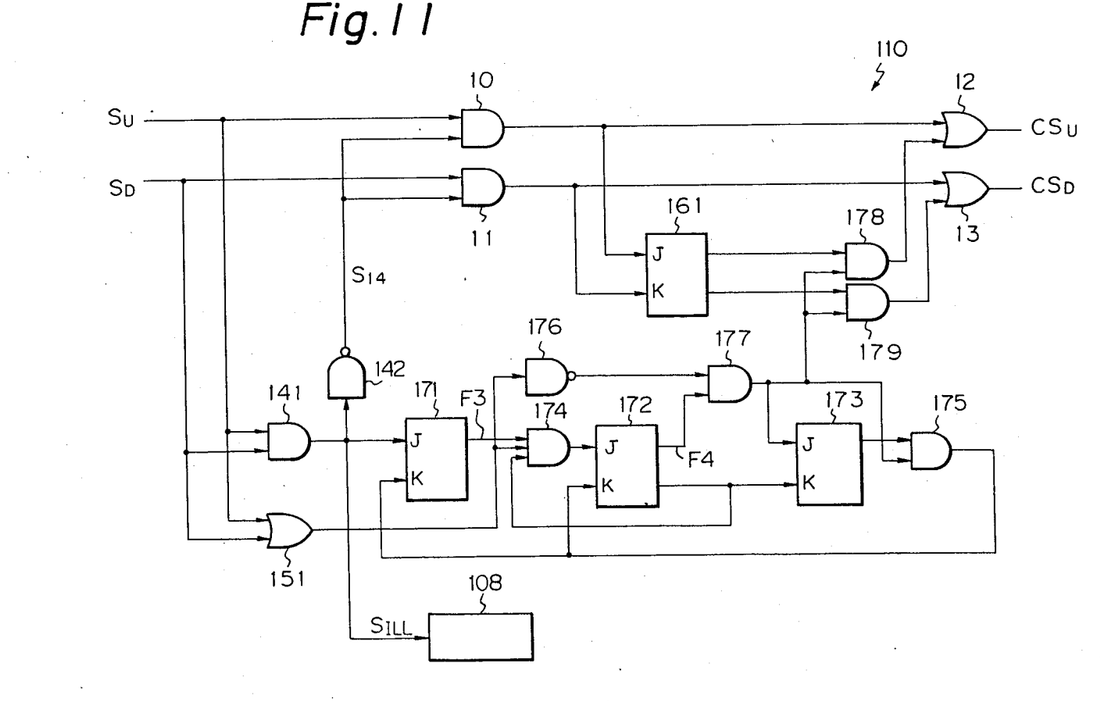
FIG. 11 is a detailed circuit diagram of the pulse-correction circuit shown in FIG. 10.

FIG. 11 is a more concrete circuit diagram of the pulse correction circuit shown in FIG. 10.

In FIG. 11, AND gates 10 and 11 and OR gates 12 and 13 are equal to those in FIG. 10. The illegal pulse detection circuit 14 of FIG. 10 is represented by an AND gate 141 and an inverter 142 in FIG. 11. The timing detection circuit 15 is formed by an OR gate 151. The direction detection circuit 16 is formed by a J-K type flip-flop (J-K F/F) 161. The correction circuit 17 consists of J-K F/F's 171 to 173, AND gates 174, 175, and 177 to 179, and an inverter 176. They are connected as shown in FIG. 11. FIG. 11 also shows the revolution rate calculation circuit 108.

The operation of the pulse correction circuit 110 will now be explained.

First, the operation in the case of a normal condition will be explained in brief.

In this case, as either the signal $S_U$ or the signal $S_D$ is applied to the pulse correction circuit 110, the output of the AND gate 141 is low level or "0" level. Thus, an output of the inverter 142 is high level. Accordingly, when the signal $S_U$ is applied, the uncorrected up signal $S_U$ is output at an output terminal of the OR gate 12 through the AND gate 10 when the signal $S_D$ is applied, the uncorrected down signal $S_D$ is output at an output terminal of the OR gate 13.

The illegal pulse detection signal $S_{ILL}$ of low level is also applied to the revolution rate calculation circuit 108. The circuit 108 is not subjected to the signal $S_{ILL}$. In other words, the circuit 108 operates in a normal condition.

Next, the correction operation of the pulse correction circuit 110 will be explained with reference to FIGS. 12A to 12I.

FIGS. 12A to 12I are timing charts of the electric circuit 10'' shown in FIG. 9. The A-phase signal SA1 (FIG. 12A) leads the B-phase signal SB1 (FIG. 12B) by 90° in phase. Thus, these timing charts are of a forward rotation.

Figure 12A:
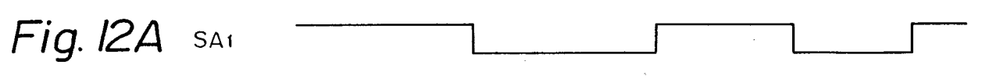
FIGS. 12A to 12I are timing charts of the electric circuit shown in FIG. 9.
Figure 12B:
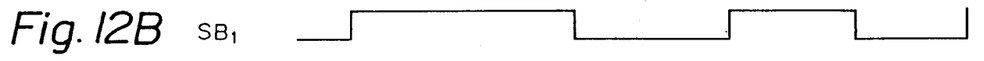
Figure 12C:
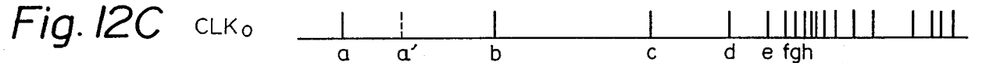
Figure 12D:
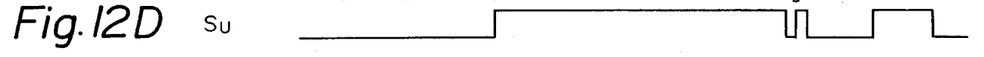
Figure 12E:
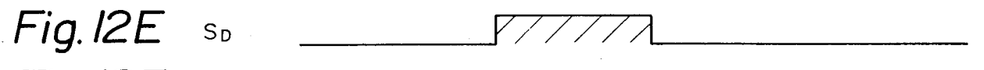

When an unexpectedly large, but short period rotational force is applied to the rotary shaft 2 while rotating at a low speed, the rotary shaft 2 is abruptly rotated, whereby the light-receiving devices 4 and 5 output high frequency signals. When a change of the A- and B-phase signals SA1 and SB1 occur between a time a and a time b as shown in FIGS. 12A to 12C, if there were a clock pulse CLK$_0$ at a time a' between the times a and b, the signal-change detection circuit 104 would detect a forward rotation. Actually, the signal-change detection circuit 104, however, cannot discriminate the rotational direction, and thus, outputs both signals S$_U$ and S$_D$ at the time b (FIGS. 12C to 12E).

In this case, the output of the inverter 142 in the illegal pulse detection circuit 14 is low, thus neither corrected signals CS$_U$ and CS$_D$ are output at the time b. On the other hand, the illegal pulse detection signal S$_{ILL}$ becomes high and is applied to the revolution rate calculation circuit 108. The circuit 108 outputs the timing-pulse frequency control signal calling for an increase in the frequency of the timing signal to the timing-pulse generator 100'. The timing-pulse generator 100' then outputs the timing pulse CLK$_0$ having a high frequency at a time d in FIG. 12C.

Figure 12F:
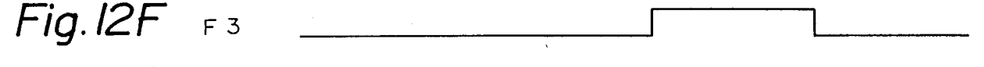

Normal forward rotation can be correctly detected in the circuit 104 at a time c in FIG. 12C. In this case, the signal S$_U$ is high and the signal S$_D$ is low, thereby only a corrected signal CS$_U$ is output (FIG. 12H). The occurrence of the two signals S$_U$ and S$_D$ is stored in the J-K F/F 171 and an F3 thereof becomes high (FIG. 12F).

Figure 12G:
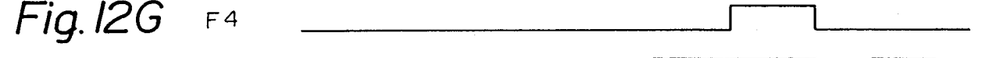
Figure 12H:
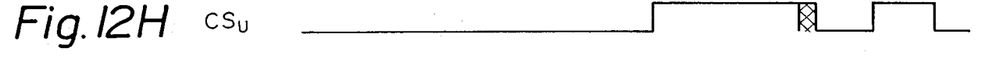
Figure 12I:
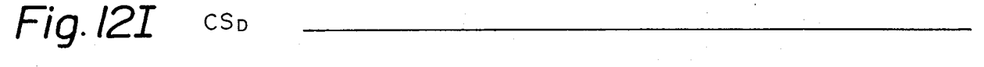

As all the inputs of the AND gate 174 are high at the time d, the J-K F/F 172 is set and an output F4 thereof becomes high (FIG. 12G).

At a time e, the signal S$_U$ remains high level, therefore, the corrected signal CS$_U$ is output. As the output of the NOR gate is low, the output of the AND gate is low. Accordingly, the J-K F/F 173 is still reset.

At a time f, as the signal S$_U$ becomes low level, an output of the OR gate 151 is low due to both signals S$_U$ and S$_D$ being low, whereby an output of the NOR gate 176 becomes high, an output of the AND gate 177 becomes high, and inputs of the AND gates 178 and 179 become high. On the other hand, as the signal S$_U$ was high and the signal S$_D$ was low at the time e, the J-K F/F 161 outputs a high level signal at a Q output terminal thereof. Thus, the corrected signal CS$_U$ is continuously output, as shown by cross lines in FIG. 12H, through the AND gate 178 and the OR gate 12.

In this way, an illegal time is detected at the inverter 176, the occurrence of illegal pulse generation is stored in the J-K F/F s, and the content stored in the J-K F/F s is output in accordance with a direction signal from the J-K F/F 161.

As the output of the AND gate 177 is high, the J-K F/F 173 is set. The output of the AND gate 175 becomes high, whereby the J-K F/F s 171 and 172 are reset. This means illegal pulse processing is completed.

After that, the revolution rate calculation circuit 108 can be restored to its normal operation condition.

The electric circuits mentioned above with reference to the specific embodiments can also be applied to a magnetic encoder apparatus having an incremental rotation detecting construction. The magnetic-type encoder apparatus includes, for example, a rotary unit, having a rotary shaft joined to the movable machine and a rotary disk mechanically connected to the rotary shaft to cooperate therewith, and a signal output unit, having a plurality of magnetic flux generating members arranged at the circumferential portion of the rotary disk a predetermined distance away and two magnetic flux sensing devices provided at opposing positions of the magnetic flux generating members, both arranged a predetermined distance away from each other.

We claim:

1. A circuit device for use with a positional encoder of an incremental type having a movable means mechanically connected to a movable machine for providing an incremental signal source in response to the movement of said movable machine, said circuit device comprising:
   a signal outputting means for outputting at least two signals each having a burst of plural pulses wherein the time duration of each burst has a low duty cycle with respect to the time duration of the period from the beginning of each burst to the beginning of a next burst, and in response to the movement of said movable means;
   circuit means including,
   (a) a timing pulse generating means for generating a timing pulse having a predetermined frequency and pulse width,
   (b) a signal-change detecting means for detecting a change of said signals from said signal outputting means and for outputting a first (up) or second (down) pulse signal in response to said change of signals,
   (c) a counting means for counting up or down a count value in response to said first and second pulse signals from the signal change detecting means, said signal outputting means and said circuit means being operable in response to said timing pulse from said timing pulse generating means, and said signal outputting means being supplied with power from said timing pulse and outputting said signals, and
   (d) timing-pulse control means for receiving the signal from said signal-change detecting means and calculating a revolution rate to be output as a timing-pulse frequency control signal in accordance with a change of the received pulse signal with time, said timing-pulse generating means varying a frequency of the timing pulse in response to the timing-pulse frequency control signal; and
   battery-type power supply means for supplying power to said circuit means.

2. The circuit device of claim 1, further including means for receiving the signal from said signal-change detecting means and for generating a timing-pulse frequency control signal in accordance with a change of the received pulse signal with time,
   wherein said timing-pulse generating means varies a frequency of the timing pulse in response to the timing-pulse frequency control signal.

3. The circuit device of claim 2, further including means for detecting illegal pulse generation from said signal-change detecting means for correcting a pulse received from said signal-change detecting means provided between said signal-change detecting means and said pulse counting means,
   wherein said timing-pulse frequency control signal generating means varies temporarily the timing-pulse frequency control signal so that a timing pulse having a higher frequency is generated from the timing-pulse generating means.

4. The circuit device of claim 3, wherein said pulse correction means includes,
   an illegal pulse detection circuit receiving the first and second pulse signals from said signal-change detecting means and outputting an illegal pulse detection signal when both of said signals are simultaneously of a threshold level, a timing detection circuit for outputting a timing signal when either one of said pulse signals is of a threshold level, a first AND gate receiving the first pulse signal at one input terminal and the illegal pulse detection signal at another input terminal, a second AND gate receiving the second pulse signal at one input terminal and the illegal pulse detection signal at another input terminal, a direction detection circuit receiving outputs from the first and second AND gates and outputting direction signals, and a pulse correction circuit for storing occurrences of the illegal pulses in response to the illegal pulse detection signal and the timing signal and outputting up or down pulse signals in response to the direction signal and due to the stored contents.

5. The circuit device of claim 4, wherein said pulse correction means includes, a first OR gate receiving the output of the first AND gate and the up signal from the pulse correction circuit, and a second OR gate receiving the output of the second AND gate and the down signal from the pulse correction circuit.

6. The circuit device of claim 4, wherein said illegal pulse detection circuit includes, an AND gate receiving the first and second pulse signals from the signal-change detection means and outputting the illegal pulse detection signal, and an inverter receiving the illegal pulse detection signal and outputting an inverted illegal pulse detection signal to the first and second AND gates.

7. The circuit device of claim 4, wherein said direction circuit comprises a J-K type flip-flop having an input terminal receiving one of the outputs from the first and second AND gates and another input terminal receiving the other of said outputs.

8. The circuit device of claim 4, wherein said pulse correction circuit includes, a first J-K flip-flop receiving the illegal pulse detection signal at a J-input terminal, a third AND gate receiving an output from a Q-output terminal of the first J-K flip-flop and the timing signal from the timing detection circuit, a second J-K flip-flop receiving an output of the third AND gate, an inverter inverting the timing signal, a fourth AND gate receiving an inverted timing signal from said inverter and an output from a Q-output terminal of the second J-K flip-flop, a third J-K flip-flop receiving an output from said fourth AND gate at a J-input terminal, a fifth AND gate receiving an output from a Q-output terminal of said third J-K flip-flop and the output from said fourth AND gate and outputting an output to K-input terminals of the first and second J-K flip-flops, a sixth AND gate receiving one of the direction signals and the output of the fourth AND gate, and a seventh AND gate receiving the other of the direction signals and the output of the fourth AND gate, inverted output of the second J-K flip-flop being applied to a third input terminal of the third AND gate and a K-input of the third J-K flip-flop.

9. The circuit device of claim 1, wherein said pulse counting means comprises:

a counter for counting the up pulse signal and having a predetermined count capacity;

another counter for counting the down pulse signal and having a predetermined count capacity; and an arithmetic circuit connected to said counters for arithmetic operations on the incremental and decremental count therefrom.

10. The circuit device of claim 1, wherein said circuit means is formed by a complementary metal-insulating semiconductor (C-MIS) device.

11. A circuit for use with a positional encoder of an incremental type having a movable means mechanically connected to a movable machine for providing an incremental signal source in response to the movement of said movable machine and including a signal outputting means for outputting at least two signals each having a burst of plural pulses wherein the time duration of each burst has a low duty cycle with respect to the time duration of the period from the beginning of each burst to the beginning of a next burst, and in response to the movement of said movable means, said circuit comprising:

(a) a timing-pulse generating means for generating a timing pulse having a predetermined frequency and pulse width, (b) a signal-change detecting means for detecting a change of said signals from said signal outputting means and for outputting a first (up) or second (down) pulse signal in response to said change of signals, (c) a counting means for counting up or down a count value in response to said first or second pulse signal from the signal change detecting means, said signal outputting means and said circuit means being operable in response to said timing pulse from said timing pulse generating means, and said signal outputting means being supplied with power from said timing pulse and outputting said signals, and (d) timing-pulse control means for receiving the signal from said signal-change detecting means and calculating a revolution rate to be output as a timing-pulse frequency control signal in accordance with a change of the received pulse signal with time, said timing-pulse generating means varying a frequency of the timing pulse in response to the timing-pulse frequency control signal.

12. The circuit of claim 11, further including means for receiving the signal from said signal-change detecting means and for generating a timing-pulse frequency control signal in accordance with a change of the received pulse signal with time, wherein said timing-pulse generating means varies a frequency of the timing pulse in response to the timing-pulse frequency control signal.

13. The circuit of claim 12, further including means for detecting illegal pulse generation from said signal-change detecting means and correcting a pulse received from said signal-change detecting means provided between said signal-change detecting means and said pulse counting means, wherein said timing-pulse frequency control signal generating means varies temporarily the timing-pulse frequency control signal so that a timing pulse having a higher frequency is generated from the timing-pulse generating means.

14. The circuit of claim 13, wherein said pulse correction means includes,
- an illegal pulse detection circuit receiving the first and second pulse signals from said signal change detecting means and outputting an illegal pulse detection signal when both of said signals are simultaneously of a threshold level,
- a timing detection circuit for outputting a timing signal when either one of said pulse signals is of a threshold level,
- a first AND gate receiving the first pulse signal at one input terminal and the illegal pulse detection signal at another input terminal,
- a second AND gate receiving the second pulse signal at one input terminal and the illegal pulse detection signal at another input terminal,
- a direction detection circuit receiving outputs from the first and second AND gates and outputting direction signals, and
- a pulse correction circuit for storing occurrences of the illegal pulses in response to the illegal pulse detection signal and the timing signal and outputting up or down pulse signals in response to the direction signal and due to the stored contents.

15. The circuit of claim 14, wherein said pulse correction means includes,
- a first OR gate receiving the output of the first AND gate and the up signal from the pulse correction circuit, and
- a second OR gate receiving the output of the second AND gate and the down signal from the pulse correction circuit.

16. The circuit of claim 14, wherein said illegal pulse detection circuit includes,
- an AND gate receiving the first and second pulse signals from the signal-change detection means and outputting the illegal pulse detection signal, and
- an inverter receiving the illegal pulse detection signal and outputting an inverted illegal pulse detection signal to the first and second AND gates.

17. The circuit of claim 14, wherein said direction circuit comprises a J-K type flip-flop having an input terminal receiving one of the outputs from the first and second AND gates and another input terminal receiving the other of said outputs.

18. The circuit of claim 14, wherein said pulse correction circuit includes,
- a first J-K flip-flop receiving the illegal pulse detection signal at a J-input terminal,
- a third AND gate receiving an output from a Q-output terminal of the first J-K flip-flop and the timing signal from the timing detection circuit,
- a second J-K flip-flop receiving an output of the third AND gate,
- an inverter inverting the timing signal,
- a fourth AND gate receiving an inverted timing signal from said inverter and an output from a Q-output terminal of the second J-K flip-flop,
- a third J-K flip-flop receiving an output from said fourth AND gate at a J-input terminal,
- a fifth AND gate receiving an output from a Q-output terminal of said third J-K flip-flop and the output from said fourth AND gate and outputting an output to K-input terminals of the first and second J-K flip-flops,
- a sixth AND gate receiving one of the direction signals and the output of the fourth AND gate, and
- a seventh AND gate receiving the other of the direction signals and the output of the fourth AND gate, inverted output of the second J-K flip-flop being applied to a third input terminal of the third AND gate and a K-input of the third J-K flip-flop.

19. The circuit of claim 11, wherein said pulse counting means comprises:
- a counter for counting the up pulse signal and having a predetermined count capacity;
- another counter for counting the down pulse signal and having a predetermined count capacity; and
- an arithmetic circuit connected to said counters for arithmetic operations on the incremental and decremental count therefrom.

20. The circuit of claim 11, wherein a lithium battery supplies power to said circuit.

21. The circuit of claim 11, wherein an alkaline-manganese battery supplies power to said circuit.

22. The circuit of claim 11, wherein said circuit is formed by a complementary metal-insulating semiconductor (C-MIS) device.

* * * * *